United States Patent
Shirakawa et al.

(10) Patent No.: US 6,943,445 B2
(45) Date of Patent: Sep. 13, 2005

(54) SEMICONDUCTOR DEVICE HAVING BRIDGE-CONNECTED WIRING STRUCTURE

(75) Inventors: Shinji Shirakawa, Hitachi (JP); Akira Mishima, Mito (JP); Keiichi Mashino, Hitachinaka (JP); Toshiyuki Innami, Mito (JP); Shinichi Fujino, Nishiibaraki (JP); Hiromichi Anan, Ibaraki (JP); Yoshitaka Ochiai, Hitachi (JP)

(73) Assignee: Hitachi, Ltd., Tokyo (JP)

(*) Notice: Subject to any disclaimer, the term of this patent is extended or adjusted under 35 U.S.C. 154(b) by 0 days.

(21) Appl. No.: 10/468,038

(22) PCT Filed: Mar. 29, 2002

(86) PCT No.: PCT/JP02/03182
§ 371 (c)(1),
(2), (4) Date: Aug. 14, 2003

(87) PCT Pub. No.: WO02/082543
PCT Pub. Date: Oct. 17, 2002

(65) Prior Publication Data
US 2004/0113268 A1 Jun. 17, 2004

(30) Foreign Application Priority Data
Mar. 30, 2001 (JP) ........................ 2001-097950

(51) Int. Cl.$^7$ ............................. H01L 23/34
(52) U.S. Cl. ............... 257/724; 257/723; 257/725
(58) Field of Search .................. 257/723–724, 257/E23.173, E25.016, 718, 713, 720, E23.084, E23.092, E23.187; 363/55–56, 132, 141, 144

(56) References Cited

U.S. PATENT DOCUMENTS

| | | | | |
|---|---|---|---|---|
| 5,777,528 A | * | 7/1998 | Schumacher et al. | 333/33 |
| 5,883,428 A | * | 3/1999 | Kabumoto et al. | 257/691 |
| 6,462,976 B1 | * | 10/2002 | Olejniczak et al. | 363/147 |
| 6,493,249 B2 | * | 12/2002 | Shirakawa et al. | 363/147 |
| 6,597,063 B1 | * | 7/2003 | Shimizu et al. | 257/687 |

FOREIGN PATENT DOCUMENTS

| | | | |
|---|---|---|---|
| EP | 0 987 762 A2 | 3/2000 | |
| EP | 4869923 A | 3/2000 | |
| JP | 10-253612 | 9/1998 | |
| JP | 11-89247 A | 3/1999 | |
| JP | 11-145376 A | 5/1999 | |
| JP | 11-145376 | * 5/1999 | ........... H01L/25/07 |

* cited by examiner

Primary Examiner—Long Pham
Assistant Examiner—Thao X. Le
(74) Attorney, Agent, or Firm—Crowell & Moring LLP

(57) ABSTRACT

The present invention provides a semiconductor device which reduces an inductance of wiring for bridge-connecting semiconductor switches and realizes a reduction in size. Within the semiconductor device formed are two controllable bridge-connected semiconductor switches 13a and 13b, an output terminal, positive/negative polarity DC terminals 2 and 3, and an insulating substrate 15a in which conductor layers 12, 17 and 19 having a conductor section and in an inner layer for bridge-connecting the semiconductor switches to the DC terminals on a surface thereof and insulating layers 16 and 18 are alternately laminated. The surface and inner-layer conductor layers 12 and 17 which interpose the insulating layer 16 therebetween are electrically connected by a conductor 20 passing through the insulating layer 16 interposed between the conductor layers 12 and 17. A current path (dotted line) is so provided as to allow current flowing through a bridge circuit for mounting the two semiconductor switches on the insulating substrate to flow in opposite directions between the conductor layers 12 and 17 which interpose the insulating layer 16 therebetween.

3 Claims, 9 Drawing Sheets

Prior Art

SEMICONDUCTOR DEVICE HAVING BRIDGE-CONNECTED WIRING STRUCTURE

TECHNICAL FIELD

The present invention relates to a semiconductor device, and particularly to a technology for reducing wiring inductance that leads to an increase in loss at switching and the occurrence of a pop-up voltage.

BACKGROUND ART

As a prior art, a technology for reducing inductance that leads to a pop-up voltage in a power converter using a semiconductor device has been disclosed in Japanese Patent Laid-open No. 11-89247. The prior technology is a method that reduces the inductance of wiring for connecting the semiconductor device and the capacitors with a conductor board laminated by interposing an insulator between the semiconductor device and the capacitors. Thereby the wiring inductance that leads to an increase in loss at switching and the occurrence of a pop-up voltage is reduced.

Now a necessary minimum circuit composition of the power converter will be explained with reference of FIG. 6. In FIG. 6, the power converter 32 comprises a semiconductor device 30 and an electrolytic capacitor 29. It is equipped with a DC power source 31, a main circuit wiring 33a, a main circuit wiring 33b, a output wiring 34 and an induction motor 35. The semiconductor device 30 inputs a DC voltage and outputs an AC current of a variable frequency to the UVE-phase output wiring 34. The induction motor 35 is driven by a current/voltage supplied through the output wiring 34. The electrolytic capacitor 29 has the function of suppressing variations in the DC voltage due to a switching operation of the semiconductor device. Although not shown in FIG. 6, in addition to the above-mentioned electric parts, the power converter is made up of a circuit substrate for controlling the switching operation of the semiconductor device 30, a cooling fin for cooling the semiconductor device 30, a cooling fan, etc.

A minimum circuit composition of a semiconductor device which is necessary to output a UVW three-phase alternating current will be explained with reference to FIG. 7. In FIG. 7, the semiconductor device 30 comprises semiconductor switches 13a, 13b, 13c, 13d, 13e and 13f, diodes 13a', 13b', 13c', 13d', 13e' and 13f', semiconductor switch control terminals 24a, 24b, 24c, 24d, 24e and 24f, a positive polarity DC terminal 3, a negative polarity DC terminal 2, a U-phase output terminal 4, a V-phase output terminal 5, and a W-phase output terminal 6. The terminals 4, 5 and 6 form a set of three-phase AC terminals. A DC voltage is applied between the positive polarity terminal 3 and the negative polarity terminal 2. In order to make it easy to understand the drawing, a drive circuit for outputting an on-off signal of each semiconductor switch has been omitted in drawings.

Power MOSFETs (Metal Oxide Semiconductor Field Effect Transistors) or IGBTs (Insulated Gate Bipolar Transistors) are used in the semiconductor switches 13a through 13f. Since the power MOSFET includes a diode in terms of a device structure when the power MOSFET is used in the semiconductor switch, the semiconductor switch 13a and the diode 13a' can be constituted by one chip.

The semiconductor switches 13a, 13c and 13e are bridge-connected with the semiconductor switches 13b, 13d and 13f, respectively.

The semiconductor device 30a applies a PWM (pulse Width Modulation) control signal voltage to the semiconductor switch control terminals 24a through 24f to control time intervals taken to turn on (open) or off (close) the bridge-connected semiconductor switches 13a through 13f. Thereby three-phase AC currents of variable frequencies/variable voltages are outputted from the three-phase AC output terminals 4, 5 and 6 to the induction motor 35. A device composition for outputting the UVW three-phase currents can be realized even by three semiconductor devices each constituted by the positive polarity terminal 3, negative polarity terminal 2, bridge-connected semiconductor switches 13a and 13b, and output terminal 6.

A wiring structure that constitutes a bridge circuit in a conventional semiconductor device is shown in FIG. 4. FIG. 4 is a perspective view showing the wiring structure in the conventional semiconductor device. In FIG. 4, reference numeral 2 designates a negative polarity DC terminal, 3 designates a positive polarity DC terminal, 4, 5 and 6 designate output terminals, 11 designates an insulator, 12a, 12b and 12c designate substrate conductor patterns, 13a and 13b designate diode and semiconductor switches, 14a, 14b, 14c, 14d and 14e designate wire interconnections. In addition, reference numeral 7 designates a radiating plate, 30 designates a semiconductor device, and 15a, 15b and 15c designate insulating boards or substrates. FIG. 4 corresponds to the case in which MOSFETs are used in the semiconductor switches and shows combinations of the semiconductor switches and diodes in the form of one part. The radiating plate 7 is made of copper, an Al—SiC alloy or the like as a material.

Although the wire interconnections 14a, 14b, 14c, 14d and 14e are illustrated four by four in FIG. 4, the number of wire interconnections varies according to specifications of the semiconductor device and the diameter of each wire interconnection, and the number of the wire interconnections is by no means limited to four. Since the semiconductor switches and wire interconnections or the like mounted on the insulating substrates 15b and 15c are similar in structure and operation to those of the insulating substrate 15a, the insulating substrate 15a will be explained below. In the following description, the negative polarity DC terminal 2 and the positive polarity DC terminal 3 indicate conductor boards that constitute them.

In FIG. 4, the substrate conductor patterns 12a, 12b, and 12c are formed on the insulating substrate 15a, and the semiconductor switches 13a and 13b are respectively implemented on the substrate conductor patterns 12a and 12b. The insulating substrate 15a electrically insulates the conductor patterns formed on the insulating substrate from the radiating plate 7. The wire interconnections 14a connect the positive polarity DC terminal 3 and the substrate conductor pattern 12a, the wire interconnections 14b connect the semiconductor switch 13a and the substrate conductor pattern 12b, the wire interconnections 14c connect the semiconductor switch 13b and the substrate conductor patterns 12c, the wire interconnections 14d connect the negative polarity DC terminal 2 and the substrate conductor pattern 12c, and the wire interconnections 14e connect the output terminal 4 and the substrate conductor pattern 12b.

When the semiconductor switches 13a and 13b performs switching from on to off in the semiconductor device 30, a current value greatly changes in a path constituted by wiring for bridge-connecting the semiconductor switches switched from on to off, wiring connected to an electrolytic capacitor and the DC terminals of the semiconductor device 30, the negative polarity DC terminal 2 and positive polarity DC terminal 3, and the electrolytic capacitor. The wiring for bridge-connecting the semiconductor switches correspond to the substrate conductor patterns 12a, 12b and 12c and the wire interconnections 14a, 14b, 14c and 14d in FIG. 4. A voltage exceeding the voltage of the electrolytic capacitor is momentarily applied to the corresponding semiconductor switch switched from on to off. The voltage (hereinafter called pop-up voltage) exceeding the electrolytic capacitor voltage is determined by the product of the total inductance of the path and electrolytic capacitor and a time-differentiated value of the current flowing through the path. When the pop-up voltage increases and the voltage applied to the corresponding semiconductor switch switched from on to off exceeds a device withstand voltage, an electrical breakdown occurs.

Thus, there is a need to suppress the pop-up voltage for the purpose of the normal operation of the semiconductor device. Since, however, the time-differentiated value of the current flowing through the path also increases with a substantial increase in current of the semiconductor device, a reduction in inductance becomes important.

A countermeasure for using each semiconductor switch high in withstand voltage is taken to cope with a problem about the pop-up voltage. When, however, the withstand voltage is increased, the semiconductor switch has a tendency that the resistance value in its on-state becomes large. Particularly, a system in which a power supply voltage is low and a large current flows in each semiconductor switch causes a problem that a loss at the semiconductor switch increases. Suppressing the pop-up voltage with the reduction in inductance makes it possible to use a semiconductor switch low in withstand voltage. Thus, large merits to the problem about the pop-up voltage, such as suppression of a rise in temperature by a reduction in the generated heat, improvements in life and reliability, or a reduction in cooling cost, etc. as its effects are brought about.

DISCLOSURE OF THE INVENTION

Meanwhile, the implementation of low-inductance wiring mounting with a small wiring area is becoming increasingly important to the demand for a substantial current increase and a size reduction of a recent semiconductor device. To this end, the conventional example shown in FIG. 4 has been discussed. As a result of its discussions, the following were found. When the amount of current flowing through the wiring for bridge-connecting the semiconductor switches changes, an eddy current opposite to the current path flows in the radiating plate 7. Therefore, the conventional example brings about the effect of reducing the inductance of the wiring for bridge-connecting the semiconductor switches if the radiating plate 7 is made of a material such as copper, AlSiC or the like relatively good in electrical conductivity. This effect results from the fact that mutual inductance caused between the current flowing through the wiring for bridge-connecting the semiconductor switches and its opposed current reduces self-inductance generated in the wiring for bridge-connecting the semiconductor switches. Also this effect has a limit due to the fact that while the current flowing through the wiring for bridge-connecting the semiconductor switches and its opposite current come close to each other and increase to such an extent as to be equal in amount, the wiring for bridge-connecting the semiconductor switches and the radiating plate 7 are spaced away from each other, and the opposite eddy current becomes a small value due to the resistance of the radiating plate 7 as compared with the amount of the current flowing through the wiring for bridge-connecting the semiconductor switches.

From the above discussions, there is a need to constitute a wiring layout on the insulating substrate so as to allow the current flowing through the wiring for bridge-connecting the semiconductor switches and its opposite current to approach and reach the same amount with a view toward further reducing the inductance of the wiring for bridge-connecting the semiconductor switches as compared with the conventional structure. If such a wiring layout can be realized, then a material good in thermal conductivity may be adopted. There is no need to adopt a material good in electrical conductivity in particular.

In view of the foregoing, an objective of the present invention is to provide a semiconductor device which reduces the inductance of wiring for bridge-connecting semiconductor switches and realizes a reduction in size.

In order to solve the above objective, within a semiconductor device, at least two conductor layers having a conductor section in which semiconductor switches are bridge-connected between the DC terminals on a surface thereof and in an inner layer thereof, and at least two insulating layers are alternately laminated to form an insulating substrate, the surface and inner-layer conductor layers interposing the insulating layer therebetween are electrically connected by a conductor passing through the insulating layer interposed between the conductor layers, and a current path is so provided as to allow current flowing through a bridge circuit for mounting at least two semiconductor switches on the insulating substrate to flow in opposite directions between the conductor layers interposing the insulating layer therebetween.

Here, such a wiring layout that no semiconductor switch is mounted on the surface conductor layer connected to the conductor passing or extending through the insulating layer is configured.

Here, a conductor block is used for a connection between an upper surface electrode of the semiconductor switch and the surface conductor layer of the insulating substrate to form a radiation path of the semiconductor switch to a radiating plate.

According to the present invention, the semiconductor device has a wiring layout at low inductance in the insulating substrate obtained by laminating the conductor boards constituting the current path. It is therefore possible to suppress the voltage applied to the corresponding semiconductor switch at switching and use a semiconductor element of a lower withstand voltage. As a result, the semiconductor device has the effect of reducing heat generated therein.

In addition, the reduction in inductance brings about the effect of reducing a loss of the semiconductor element at switching. Also the reduction in the generated heat is effective in improving reliability and in reducing cooling cost.

According to the present invention, the area of an insulating substrate portion is reduced. Therefore, the present invention is effective even in reducing the semiconductor device in size. Owing to the effect, a power converter can be provided using a semiconductor device which realizes a significant increase in current and a reduction in size.

BEST MODE FOR CARRYING OUT THE INVENTION

Figure 1:
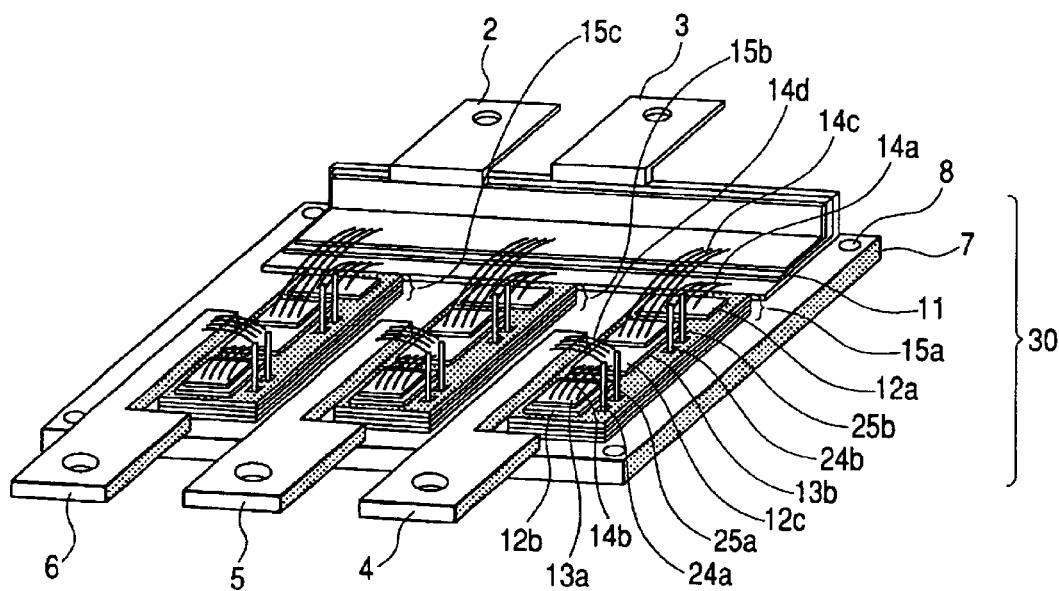
FIG. 1 is a general view showing a wiring structure of a semiconductor device according to a first embodiment of the present invention.

Embodiments of the present invention will hereinafter be described based on the accompanying drawings. The same objects and those each having the same function in FIGS. 1 through 16 are respectively identified by the same reference numerals. In order to make it easier to understand the drawings, a drive circuit for driving each semiconductor switch is omitted in drawings.

FIG. 1 is a general view showing a wiring structure of a semiconductor device according to a first embodiment of the present invention. In FIG. 1, a semiconductor device 30 is shown. Reference numeral 2 designates a negative polarity DC terminal, 3 designates a positive polarity DC terminal, 4, 5 and 6 designate output terminals and a wiring board, 7 designates a radiating plate, 8 designate threaded holes, and 11 designates an insulating board. In addition, reference numerals 12a, 12b and 12c designate substrate conductor patterns, 13a and 13b designate diode and semiconductor switches, 14a, 14b, 14c and 14d designate wire interconnections, 15a, 15b and 15c designate insulating boards or substrates, 24a and 24b designate gate signal terminals, and 25a and 25b designate ground terminals. The respective terminals 2, 3, 4, 5 and 6 are provided with wiring mounting holes. The threaded holes 8 are used when a cooling fin and the radiating plate 7 are fixed with bolts or the like.

Although the wire interconnections 14a, 14b, 14c and 14d are illustrated four by four in FIG. 1, the number of wire interconnections varies according to specifications of the semiconductor device and the diameter of each wire interconnection. In the present embodiment, the number of the wire interconnections is not limited to four. Since the semiconductor switches and wire interconnections or the like mounted on the insulating substrates 15b and 15c are similar in structure and operation to those of the insulating substrate 15a, the insulating substrate 15a will be explained below.

In FIG. 1, the substrate conductor patterns 12a, 12b, and 12c are formed on the insulating substrate 15a, and the semiconductor switches 13a and 13b are respectively implemented on the substrate conductor patterns 12a and 12b. The wire interconnections 14a connect the positive polarity DC terminal 3 and the substrate conductor pattern 12a, the wire interconnections 14b connect the semiconductor switch 13a and the substrate conductor pattern 12b, the wire interconnections 14c connect the semiconductor switch 13b and the substrate conductor patterns 12c, the wire interconnections 14d connect the negative polarity DC terminal 2 and the substrate conductor pattern 12c, and the wire interconnections 14e connect the output terminal 4 and the substrate conductor pattern 12b. In each semiconductor switch employed in the present embodiment, the surface thereof connected to the corresponding wire interconnections is a source electrode surface, and the surface thereof connected to the corresponding substrate conductor pattern is a drain electrode surface.

In the present embodiment, the diode and semiconductor switches comprise MOSFETs. The gate signal terminals 24a and 24b are respectively connected to gate electrodes of the semiconductor switches 13a and 13b, and the ground terminals 25a and 25b are respectively connected to source electrodes of the semiconductor switches 13a and 13b. The gate signal terminals 24a and 24b and the ground terminals 25a and 25b are connected to an unillustrated drive circuit substrate. However, the diode and semiconductor switches employed in the present embodiment are not necessarily limited to the MOSFETs. They may be a combined one of IGBTs and diodes.

The insulating substrate 15a constitutes a laminated structure made up of a plurality of conductor boards and insulating boards. Its structure will be explained with reference to FIG. 3.

The substrate conductor patterns 12a, 12b and 12c are formed in the insulating substrate 15a. The conductor boards 12a and 12b are brought into conduction by a conductor lying in an internal layer of the insulating substrate 15a and other conductors passing or extending through an insulating layer located therebetween.

FIG. 1 shows a structure wherein in the semiconductor device, the positive polarity DC terminal 3 and the substrate conductor pattern 12a are connected by the wire interconnections 14a, the semiconductor switch 13a mounted on the substrate conductor pattern 12b and the substrate conductor pattern 12c are connected by the wire interconnections 14b, and the semiconductor switch 13b mounted on the substrate conductor pattern 12c and the negative polarity DC terminal 2 are connected by the wire interconnections 14c.

Figure 2:
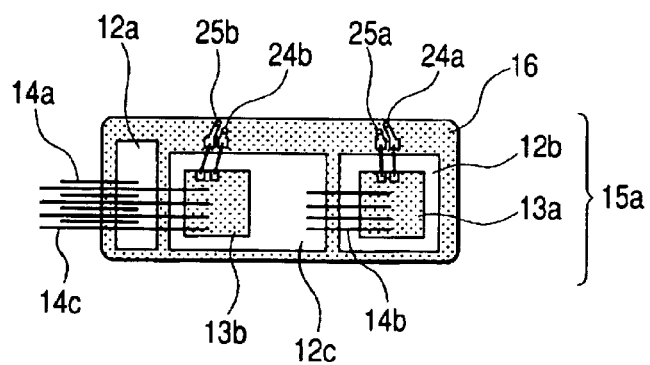
FIG. 2 is a plan view of an insulating substrate in FIG. 1.

FIG. 2 is a plan view of the insulating substrate 15a in FIG. 1. In FIG. 2, reference numerals 12a, 12b and 12c designate substrate conductor patterns, 13a and 13b designate semiconductor switches, 14a, 14b and 14c designate wire interconnections, 15a designates an insulating substrate, 16 designates an insulating board, 24a and 24b designate gate signal terminals, and 25a and 25b designate ground terminals.

Figure 3:
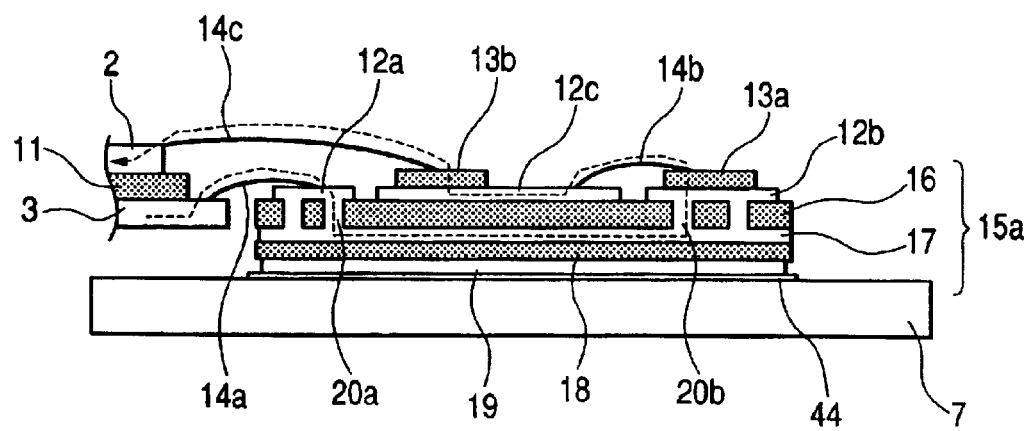
FIG. 3 is a schematic diagram illustrating a sectional structure of the laminated insulating substrate in FIG. 1.

FIG. 3 is a schematic diagram showing a sectional structure of the laminated insulating substrate 15a shown in FIG.

1. In FIG. 3, reference numeral 2 designates a negative polarity DC terminal, 3 designates a positive polarity DC terminal, 7 designates a radiating plate, 11 designates an insulating board, 12a, 12b and 12c designate substrate conductor patterns, 13a and 13b designate semiconductor switches, 14a, 14b and 14c designate wire interconnections, 15a designates an insulating substrate, 16 and 18 designate insulating boards, 17 and 19 designate conductor boards, 20a and 20b designate conductors, and 44 designates solder.

The insulating substrate 15a has a structure wherein as shown in FIG. 3, the insulating boards 16 and 18 and the conductor boards 17 and 19 are laminated, the substrate conductor patterns 12a, 12b and 12c for mounting the semiconductor switches and wire interconnections are formed on its upper surface, and the substrate conductor patterns 12a and 12b are respectively connected to the conductor board 17 by the conductors 20a and 20b extending or passing through the insulating board 16. In the insulating substrate 15a, the insulting board and the conductor board take an integral structure in which they are face-bonded to each other with a brazing filler metal or the like. The conductor board 19 is used to bond and fix the insulating substrate 15a to the radiating plate 7 with the solder 44 or the like but unnecessary where it can be fixedly secured to the radiating plate 7 by another technique.

Since the conductor board 17 is a portion through which current flows, as will be described below, it is necessary to electrically isolate the conductor board 17 from the radiating plate or a cooler. Thus, there is a need to newly interpose an insulating sheet between the radiating plate or cooler and the conductor board 17 if the conductor board 17 has a bare structure. However, the effect of suppressing an increase in temperature, which is equivalent to the effect of the present embodiment, comes to nothing in that the insulating sheet non-adhered to the conductor board 17 increases in thermal resistance and hence thermal radiation becomes hard. In the present embodiment, the conductor board 17 is electrically isolated from the radiating plate 7 by the insulating board 18 of the insulating substrate, and the radiating plate 7 is brought into surface-contact with the cooler so as to constitute a path for transmitting heat generated in the semiconductor switches 13a and 13b to the cooler.

Thus, the present embodiment is characterizes by using an insulating substrate wherein at least a conductor layer serving as a surface on which semiconductor switches are mounted, an insulating layer, another conductor layer and another insulating layer are laminated in order.

In the structure of FIG. 3, gate signal terminals and ground terminals are provided at an upper surface of the insulating substrate 15a. Aluminum nitride, silicon nitride or alumina is used for the insulators 16 and 17 of the insulating substrate 15a as a material. A material having good conductivity, such as copper or the like is used for the conductor boards 12a, 12b, 12c, 17 and 19 as a material. The wire interconnections 14a, 14b, 14c and 14d are made of alumina as a material. In the present embodiment, the wire interconnections shown in FIG. 3 may be replaced with plate-shaped conductors made of copper or alumina or the like by using technologies such as solder, ultrasonic bonding, etc.

A description will be made below using FIG. 3, of a case in which in the semiconductor device 30 shown in FIG. 1, the mount structure of the insulating substrate shown in FIGS. 2 and 3 is a structure for reducing inductance that leads to the occurrence of a pop-up voltage, which presents the problem to be solved by the present invention.

In FIG. 3, a current path that causes the pop-up voltage is as indicated by a dotted line and extends in the order of the positive polarity DC terminal 3, wire interconnections 14a, substrate conductor pattern 12a, conductor 20a, conductor board 17, conductor 20b, substrate conductor pattern 12b, semiconductor switch 13a, wire interconnections 14b, substrate conductor pattern 12c, semiconductor switch 13b, wire interconnections 14c, and negative polarity DC terminal 2.

The present structure takes such a layout that current that varies when the semiconductor switches 13a and 13b are respectively switched from on to off, is in an opposing relation between the conductor board 17 and substrate conductor patterns 12a, 12b and 12c, and flows therethrough in the same amount. Owing to electromagnetic induction produced between the current paths opposed therebetween, the absolute value of the mutual inductance generated thereat is therefore close to the absolute value of self-inductance, so that the inductance generated in the current path on the insulating substrate is further reduced.

Figure 4:
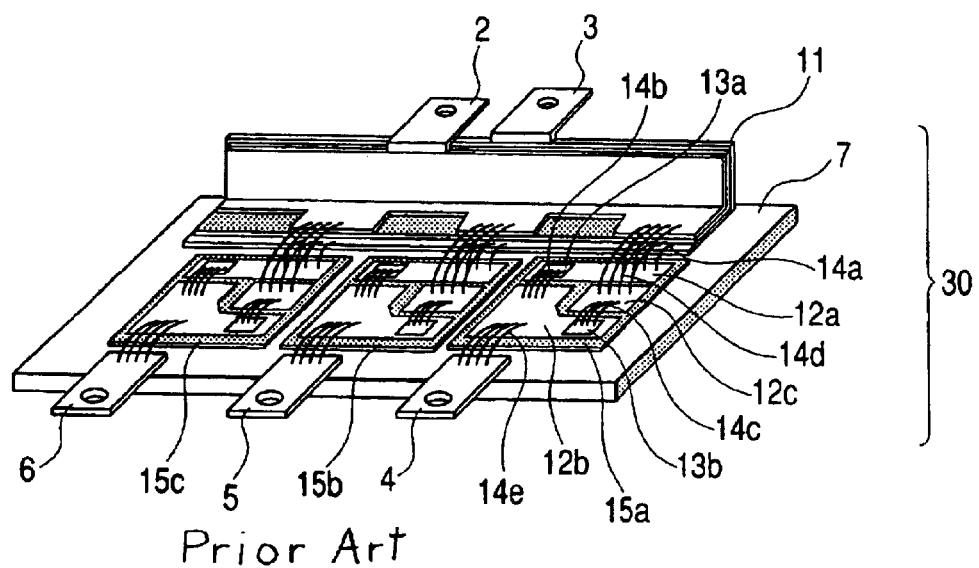
FIG. 4 is a perspective view depicting a wiring structure of a conventional semiconductor device.

A comparison is made between the size of the insulating substrate and the inductance thereof by use of the conventional example of FIG. 4 and the structure of the present embodiment of FIG. 1. When the size of the insulating substrate 15a is assumed to be about 3 cm square in the structure of FIG. 4, the inductance generated in a path of current flowing over the insulating substrate is about 10 nH. On the other hand, the size of the insulating substrate employed in the present embodiment results in about 1.5 cm×3 cm, and the inductance generated on the insulating substrate becomes about 5 nH. According to the above discussions, the present embodiment reduces the area of the insulating substrate to about ½ and reduces the inductance to about 5 nH, and bring about its large effect. Also the reduction in the area of the insulating substrate enables miniaturization of the semiconductor device.

It can be said from the above description that the present embodiment produces a large effect on the reductions in both the area of the insulating substrate and the inductance. The current path is isolated from the radiating plate or cooler by the insulator 18, and the radiation of from the insulating substrate to the radiating plate and cooler is identical to the conventional structure. Therefore, the present structure results in a structure wherein the effect of suppressing an increase in the generated heat/temperature due to the reduction in inductance is not impaired.

Figure 5:
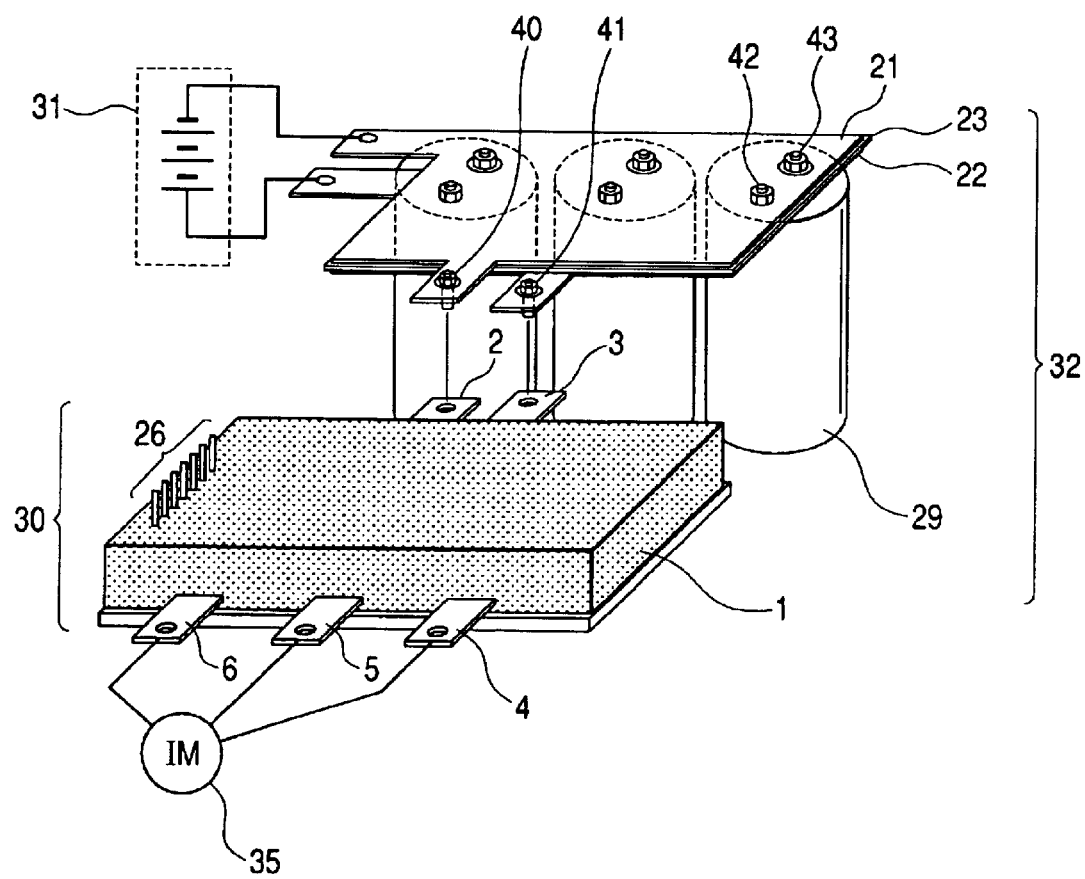
FIG. 5 is a configurational view of a power converter using a semiconductor device of the present invention.
Figure 6:
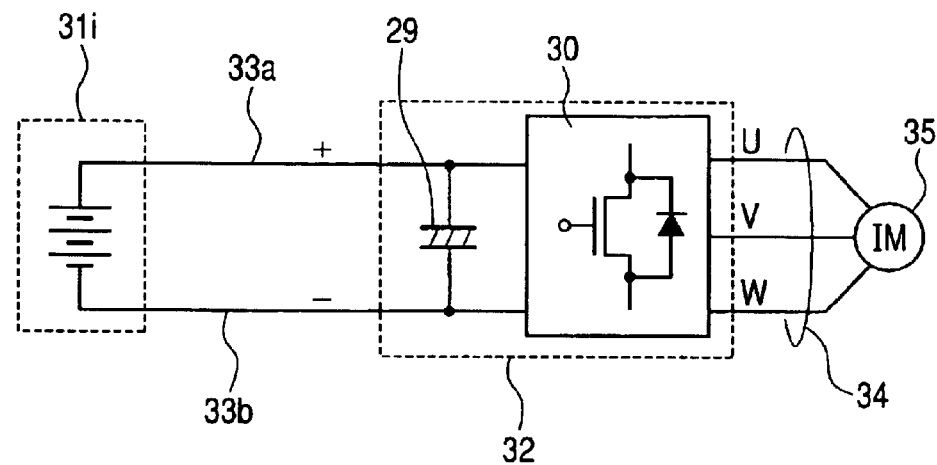
FIG. 6 is a required minimum circuit configurational view of a power converter.
Figure 7:
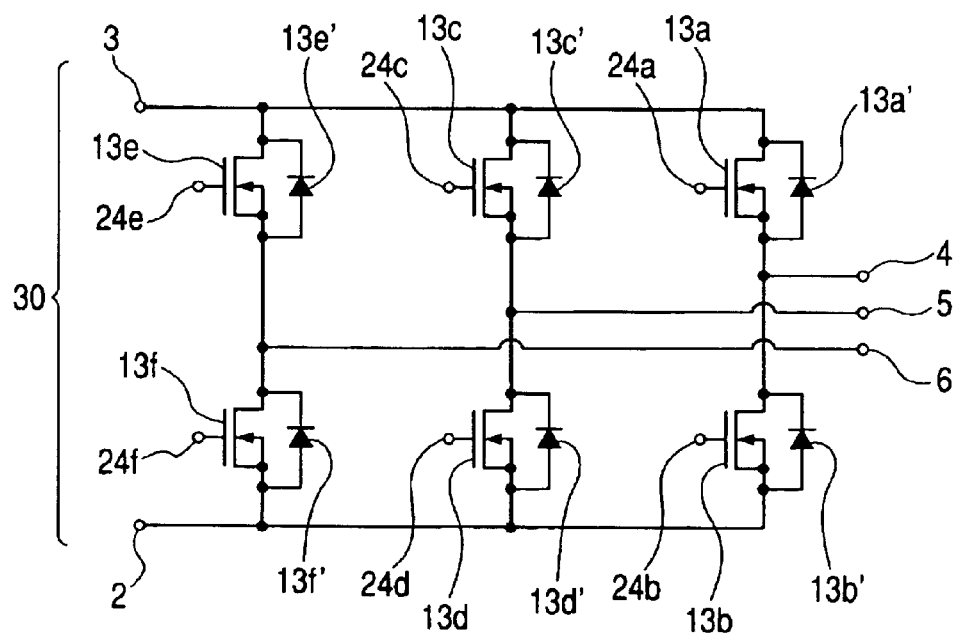
FIG. 7 is a circuit configurational view of a semiconductor device set to the minimum necessary to output a UVW three-phase alternating current.

A power converter using the semiconductor device of the present invention will be explained using FIG. 5. FIG. 5 is one example of a power converter using the first embodiment of FIG. 1.

In FIG. 5, reference numeral 32 designates a power converter, 1 designates a case, 2 designates a negative polarity DC terminal, 3 designates a positive polarity DC terminal, 4, 5 and 6 designate output terminals, 21 and 22 designate conductor boards, 23 designates an insulating board, 26 designate auxiliary control terminals, 29 designate electrolytic capacitors, 30 designates a semiconductor device, 31 designates a DC power source, 35 designates an induction motor, and 40, 41, 42 and 43 designate bolts. In FIG. 5, the negative polarity DC terminal 2 and the conductor board 21, and the positive polarity DC terminal 3 and the conductor board 22 are respectively brought into conduction by the bolts 40 and 41. The conductor board 21 and the conductor board 22 constitute a layered structure in which the insulating board 23 is interposed therebetween. Terminals of the electrolytic capacitors 29 are respectively connected to the conductor boards 21 and 22 by using the bolts 42 and 43. The auxiliary control terminals 26 are used for transmission and reception of an output command signal or the like.

In FIG. 5, the power converter 32 comprises the semiconductor device 30, the electrolytic capacitors 29 and wiring for connecting them to one another. Incidentally, the electrolytic capacitors 29 in the power converter according to the present embodiment are not limited to the electrolytic capacitors and may be capacitors each having electrostatic capacity sufficient to meet usage conditions.

In the power converter shown in FIG. 5, the inductance leading to the pop-up voltage is reduced by use of the semiconductor device according to the first embodiment of FIG. 1. Therefore, a reduction in cooling cost is enabled owing to a reduction in the generated heat, which is indicative of above effect. With a size reduction in the semiconductor device, the power converter can be also brought into less size.

While the semiconductor device 30 outputting a three-phase alternating current has been explained in the first embodiment of the present invention, the present invention is related to an insulating substrate constituting a bridge circuit corresponding to one phase. Thus, the present invention can obtain a similar effect even in the case of a semiconductor device that outputs current of one phase.

Figure 8:
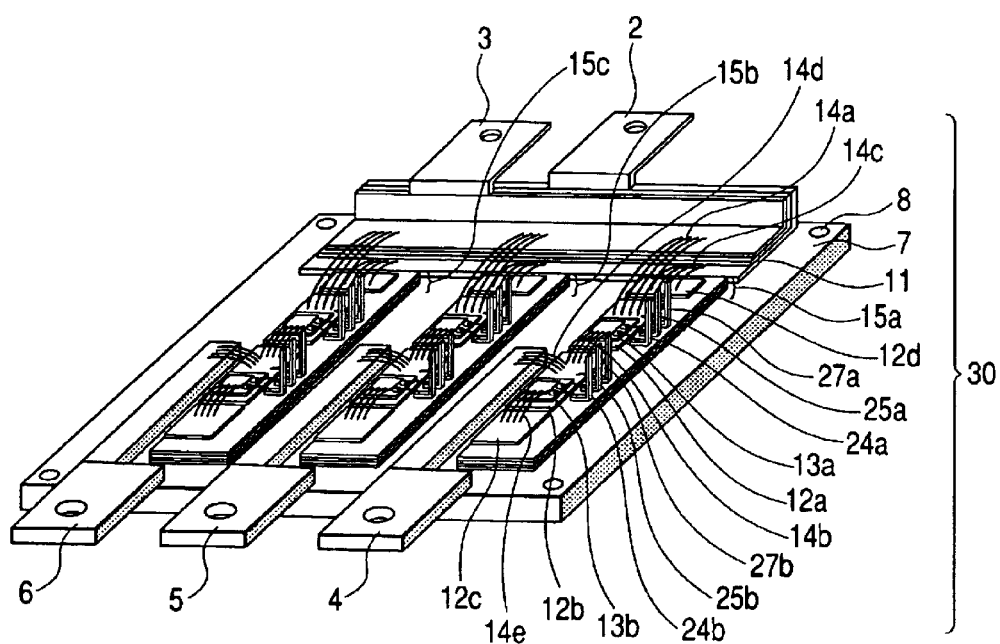
FIG. 8 is a perspective view showing a wiring structure of a semiconductor device according to a second embodiment of the present invention.

A description will next be made of a wiring layout for increasing the longevity of solder joining between semiconductor switches and substrate conductor patterns employed in a semiconductor device according to a second embodiment of the present invention, with reference to FIGS. 8 and 9. FIG. 8 is a perspective view showing a wiring structure of the semiconductor device according to the present embodiment, with a case portion of the semiconductor device omitted in drawing.

In FIG. 8, reference numeral 30 designates the semiconductor device, reference numeral 2 designates a negative polarity DC terminal, 3 designates a positive polarity DC terminal, 4, 5 and 6 designate output terminals and a wiring board, 7 designates a radiating plate, reference numerals 8 designate threaded holes, 11 designates an insulating board, 12a, 12b, 12c and 12d designate substrate conductor patterns, 13a and 13b designate diode and semiconductor switches, 14a, 14b, 14c, 14d and 14e designate wire interconnections, 15a, 15b, and 15c designate insulating substrates, 24a and 24b designate gate signal terminals, 25a and 25b designate ground terminals, and 27a and 27b designate drain signal terminals. The terminals 2, 3, 4, 5 and 6 are respectively provided with wiring mounting holes. The threaded holes 8 are used when a cooling fin and the radiating plate 7 are fixed with bolts or the like. The respective terminals 24a, 24b, 25a, 25b, 27a and 27b are connected to their corresponding conductor patterns provided on the insulating substrate 15a by solder or the like.

Although the wire interconnections 14a, 14b, 14c, 14d and 14e are illustrated four by four in FIG. 8, the number of wire interconnections varies according to specifications of the semiconductor device and the diameter of each wire interconnection. In the present embodiment, the number of the wire interconnections is not limited to four. Further, the semiconductor device shown in FIG. 8 is a device for outputting a three-phase alternating current, and the semiconductor switches and wire interconnections or the like mounted on the insulating substrates 15b and 15c are similar in structure and operation to those of the insulating substrate 15a. Therefore, the insulating substrate 15a will be explained below.

In FIG. 8, the substrate conductor patterns 12a, 12b, 12c and 12d are formed on the insulating substrate 15a, and the semiconductor switches 13a and 13b are respectively implemented on the substrate conductor patterns 12a and 12b by solder. The wire interconnections 14a connect the positive polarity DC terminal 3 and the substrate conductor pattern 12a, the wire interconnections 14b connect the semiconductor switch 13a and the substrate conductor pattern 12b, the wire interconnections 14e connect the semiconductor switch 13b and the substrate conductor pattern 12c, the wire interconnections 14c connect the negative polarity DC terminal 2 and the substrate conductor pattern 12d, and the wire interconnections 14d connect the output terminal 4 and the substrate conductor pattern 12b. In each semiconductor switch employed in the present embodiment, the surface thereof connected to the corresponding wire interconnections is a source electrode surface, and the surface thereof connected to the corresponding substrate conductor pattern is a drain electrode surface.

In the present embodiment, the diode and semiconductor switches comprise MOSFETs. The gate signal terminals 24a and 24b are respectively connected to gate electrodes of the semiconductor switches 13a and 13b, the ground terminals 25a and 25b are respectively connected to source electrodes of the semiconductor switches 13a and 13b, and the drain signal terminals 27a and 27b are respectively connected to the substrate conductor patterns 12a and 12b. The gate signal terminals 24a and 24b and ground terminals 25a and 25b, and the drain signal terminals 27a and 27b are connected to an unillustrated drive circuit substrate. However, the diode and semiconductor switches employed in the present embodiment are not limited to the MOSFETs. They may be a combination of IGBTs and diodes.

The insulating substrate 15a has a laminated structure made up of a plurality of conductor boards and insulating boards. Its structure will be explained with reference to FIG. 9.

Figure 9:
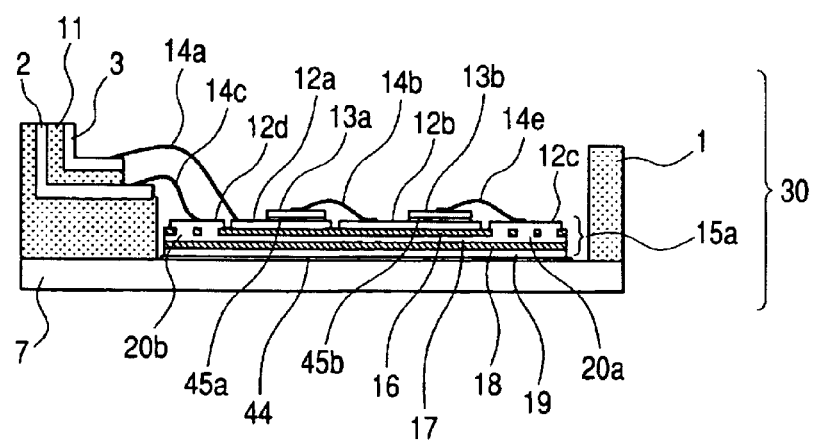
FIG. 9 is a sectional structural view of the semiconductor device shown in FIG. 8.

FIG. 9 shows a sectional structure of the semiconductor device according to the present embodiment. In FIG. 9, reference numeral 30 designates a semiconductor device, 1 designates a case, 2 designates a negative polarity DC terminal, 3 designates a positive polarity DC terminal, 7 designates a radiating plate, 11 designates an insulating board, 12a, 12b, 12c and 12d designate substrate conductor patterns, 13a and 13b designate semiconductor switches, 14a, 14b and 14c designate wire interconnections, 15a designates an insulating substrate, 16 and 18 designate insulating boards, 17 and 19 designate conductor boards, 20a and 20b designate conductors, 44 designates solder, and 45a and 45b designate solders, respectively.

In FIG. 9, the insulating substrate 15a comprises the substrate conductor patterns 12a, 12b, 12c and 12d, and the insulating boards 16 and 18 are respectively made up of the conductor boards 17 and 19, and the conductors 20a and 20b. The substrate conductor patters 12c and 12d formed on the insulating substrate 15a are respectively brought into conduction by the conductor 17 lying in an inner layer of the insulating substrate 15a, and the conductors 20a and 20b extending or passing through an insulating layer lying therebetween. The insulating board 18 insulates the conductor board 17 from the conductor board 19.

In FIG. 9, a current path that generates a pop-up voltage extends in the order of the positive polarity DC terminal 3, wire interconnections 14a, substrate conductor pattern 12a, semiconductor switch 13a, wire interconnections 14b, substrate conductor pattern 12b, semiconductor switch 13b, wire interconnections 14e, substrate conductor pattern 12c, conductor 20a, conductor board 17, conductor 20b, substrate conductor pattern 12d, wire interconnections 14c, and negative polarity DC terminal 2.

Owing to the present wiring layout, a current that varies when the semiconductor switches 13a and 13b are respectively switched from on to off is in an opposing relation between the conductor board 17 and substrate conductor patterns 12a, 12b, 12c and 12d, and flows closely. Therefore, the effect of reducing a pop-up voltage is brought about, which is similar to the structure described in the first embodiment (from FIG. 1 to FIG. 3) of the present invention.

In addition to it, the structure shown in FIGS. 8 and 9 takes a layout in which the semiconductor switches 13a and 13b are not located on the substrate conductor patterns 12c and 12d connected to the conductors 20a and 20b respectively. This is effective in enhancing the reliability of solder for connecting semiconductor chips and substrate conductor patterns, which is described later.

The parts of the semiconductor device repeat their expansion and shrinkage according to temperature cycles indicative of increases in temperatures of the semiconductor switch, insulating substrate, radiating plate and the like during the operation, and decreases in their temperatures during the non-operation. Distortion caused by the difference between expansion rates or coefficients developed in the semiconductor switch, insulating substrate and radiating plate plastically deforms solder for bonding them together and produces cracks little by little every temperature cycles. It is therefore necessary to reduce the distortion in order to increase the life of the solder. It is understood that assuming that, for example, the coefficient of thermal expansion of the semiconductor switch using silicon is about 3 m$\mu$/° C., the coefficient of thermal expansion of the insulating substrate is set so as to range from about 3 m$\mu$/° C. to about 4 m$\mu$/° C., and the coefficient of thermal expansion of the radiating plate (copper) is about 18 m$\mu$/° C., the difference in the coefficient of thermal expansion between the semiconductor switch and the copper increases.

In the insulating substrate that constitutes the semiconductor device of the present embodiment and includes the inner conductor layer (conductor board 17) serving as the current path, if the conductor is made of copper, the substrate conductor patterns 12c and 12d to which the conductors 20a and 20b shown in FIG. 9 are connected become high in the proportion of copper in the volume and increase in the coefficient of expansion as compared with other portions of the insulating substrate. Therefore, when the semiconductor switches are located on their corresponding conductor patterns 12c and 12d, distortion of solder for bonding the semiconductor switch and the conductor pattern increases.

Thus, in order to improve the reliability of the solder, the semiconductor switches are located on their corresponding conductor patterns 12a and 12b unconnected with the conductors 20a and 20b in the semiconductor device described in FIGS. 8 and 9. Since the layout shown in each of FIGS. 8 and 9 corresponds to such a layout that the conductor 17 of the internal layer in the insulating substrate is connected to the negative polarity DC terminal so as to take the same potential as the negative polarity, the effect of reducing a leakage current developed due to the floating electrostatic capacity from the insulating substrate to the radiating plate is also obtained.

Figure 10:
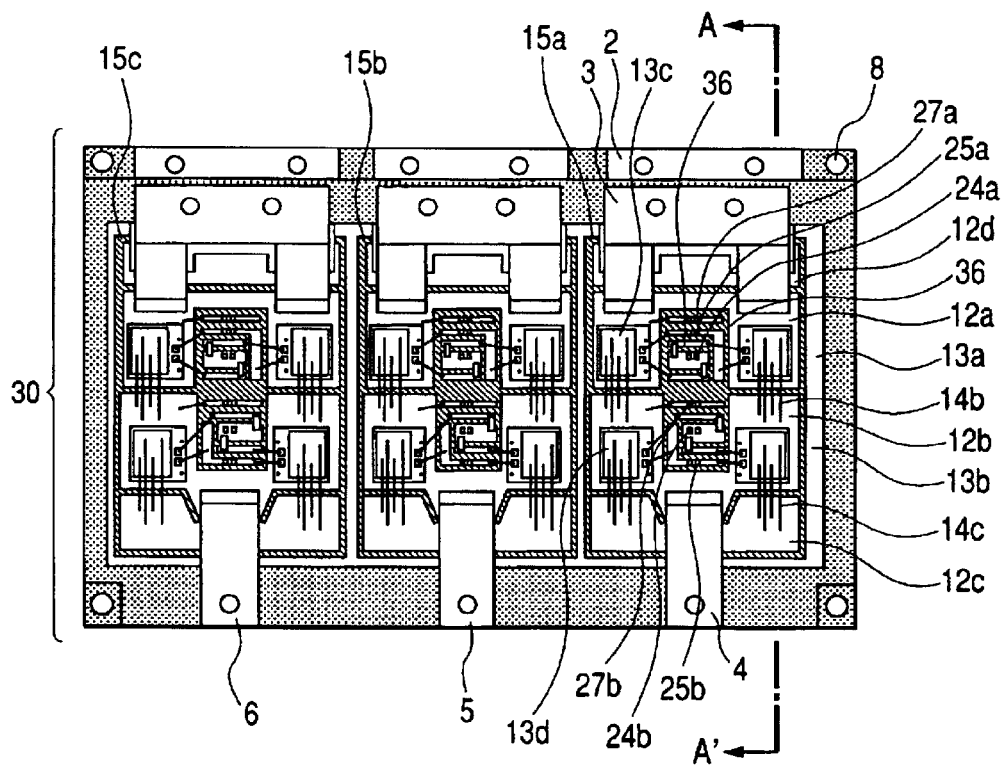
FIG. 10 is a wiring structural view of a semiconductor device with semiconductor switches arranged in parallel, according to a third embodiment of the present invention.

A semiconductor device according to a third embodiment of the present invention, wherein semiconductor switches are arranged in parallel, will next be explained with reference to FIGS. 10 and 11. FIG. 10 is a plan view of the semiconductor device employed in the present embodiment with the semiconductor switches arranged in a two parallel form. In FIG. 10, the upper surface portion of a case of the semiconductor device has been omitted from FIG. 10 to show an internal wiring structure.

In FIG. 10, reference numeral 30 designates a semiconductor device, reference numeral 2 designates a negative polarity DC terminal, 3 designates a positive polarity DC terminal, 4, 5 and 6 designate output terminals and a wiring board, 13a, 13b, 13c and 13d designate diode and semiconductor switches, 14b and 14e designate wire interconnections, 15a, 15b and 15c designate insulating substrates, 24a and 24b designate gate signal terminals, 25a and 25b designate ground terminals, 27a and 27b designate drain signal terminals, and 36 designates a resistor. The terminals 2, 3, 4, 5 and 6 are respectively provided with wire mounting holes. Threaded holes 8 are used to secure a cooling fin and a radiating plate 7 with bolts or the like. The respective terminals 24a, 24b, 25a, 25b, 27a and 27b are connected to their corresponding conductor patterns provided on the insulating substrate 15a by solder or the like. The resistor 36 is a circuit element located in a gate wiring to suppress an oscillation phenomenon caused by gate-to-drain capacitances of the semiconductor switches 13a and 13c located in parallel, and the inductance of wiring including the gate wiring. Similar resistors are located also in gate wiring for the semiconductor switches 13b and 13d although their explanation of numerals has been omitted.

Figure 11:
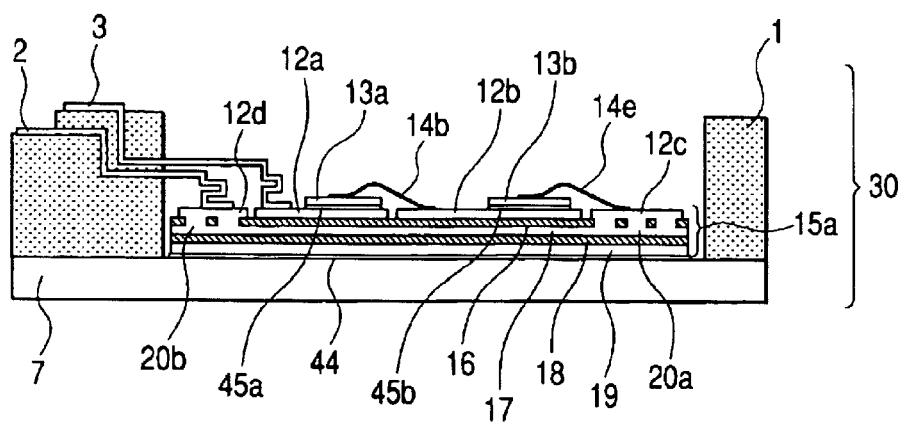
FIG. 11 is a sectional structural view of the semiconductor device shown in FIG. 10.

FIG. 11 shows a sectional structure of the semiconductor device of FIG. 10, which is taken along line A—A'. In FIG. 11, reference numeral 30 designates a semiconductor device, 1 designates a case, reference numeral 2 designates a negative polarity DC terminal, 3 designates a positive polarity DC terminal, 7 designates a radiating plate, 11 designates an insulating board, 12a, 12b, 12c and 12d designate substrate conductor patterns, 13a and 13b designate semiconductor switches, 14a, 14b and 14c designate wire interconnections, 15a designates an insulating substrate, 16 and 18 designate insulating boards, 17 and 19 designate conductor boards, and 20a and 20b designate conductors.

In FIG. 11, the insulating substrate 15a comprises the substrate conductor patterns 12a, 12b, 12c and 12d, the insulating boards 16 and 18, the conductor boards 17 and 19, and the conductors 20a and 20b. The substrate conductor patterns 12c and 12d formed on the insulating substrate 15a are respectively brought into conduction by the conductor 17 lying in an internal layer of the insulating substrate 15a, and the conductors 20a and 20b extending through an insulating layer lying therebetween. Further, the insulating board 18 insulates the conductor board 17 from the conductor board 19.

In FIG. 11, the sectional structure of the insulating substrate 15 taken along line A—A' is substantially identical to the sectional structure shown in FIG. 9. In FIG. 11, the negative polarity DC terminal 1 and the positive polarity DC terminal 3 are made up of plates or boards each having a bent structure and bonded to their corresponding substrate conductor patterns of the insulating substrate 15a by solder or the like.

In the semiconductor device in which the semiconductor switches intended for the present structure have been arranged in parallel, a heating unbalance proportional to the square of a current value takes place where an unbalance occurs between currents flowing through the parallelized semiconductor switches. Thus, since there is a need to avoid the heat of the semiconductor switch higher in generated heat from exceeding an operation guaranteed temperature, the maximum current value for assuring the normal operation of the semiconductor device is reduced, i.e., its device performance is degraded. In order to uniformize the currents flowing through the parallelized semiconductor switches, there is a need not only to cause the electrical characteristics of the parallelized semiconductor switches to coincide with each other but also to allow the electrical characteristics of current paths to coincide with each other. To this end, a wiring layout for bringing the current paths into symmetry is effective. However, this method has the demerit of increasing the size of an insulating substrate having conductor patterns provided on its surface alone.

In the wiring layout of the semiconductor device according to the present embodiment shown in FIGS. 10 and 11, the conductors lying in the internal layer of the insulating substrate are configured as the current paths, and the wiring patterns for the gate signal terminals, ground terminals and drain terminals necessary for switching control are located in the center of the insulating substrate. In the present wiring layout, the current path through which the current flows from the semiconductor switch 13*a* to the semiconductor switch 13*b*, and the current path through which the current flows from the semiconductor switch 13*c* to the semiconductor switch 13*d* are symmetrized using the conductors lying in the internal layer of the insulating substrate, whereby a size reduction in the insulating substrate is realized in a state in which a current unbalance has been kept.

In the present embodiment, the conductor boards of the negative polarity DC terminal 1 and the positive polarity DC terminal 3 each having the bent structure are laid out in laminated form with the insulator interposed therebetween to thereby realize reductions in inductance at the DC terminals in addition to the reduction in inductance by the layout of the insulating substrate. While the semiconductor device reduces the amount of generated heat owing to the parallel arrangement of the semiconductor switches to enable larger current switching, in this case there is a need to further suppress the pop-up voltage. Therefore, the inductance reduction showing the characteristic of the present wiring layout becomes more effective on the semiconductor device in which the semiconductor switches are arranged in parallel for the purpose of a substantial increase in current.

Figure 12:
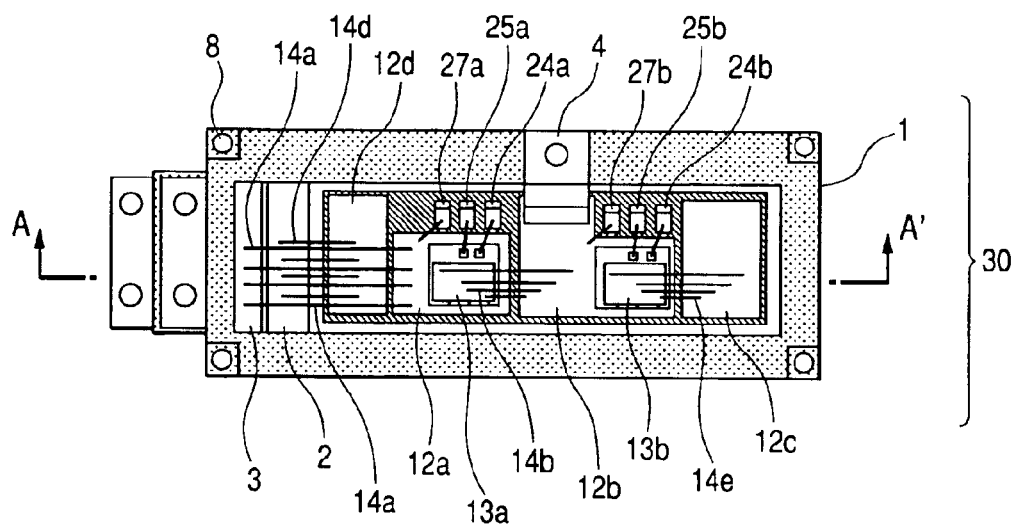
FIG. 12 is a wiring structural view of a semiconductor device according to a fourth embodiment of the present invention, from which current of one phase is output.

A semiconductor device according to a fourth embodiment of the present invention, which outputs current of one phase, will next be described with reference to FIGS. 12 and 13. FIG. 12 is a plan view of the semiconductor device according to the present embodiment. In FIG. 12, the upper surface portion of a case of the semiconductor device has been omitted to show an internal wiring structure.

In FIG. 12, reference numeral 30 designates a semiconductor device, 1 designates a case, 2 designates a negative polarity DC terminal, 3 designates a positive polarity DC terminal, 4 designates an output terminal, 13*a* and 13*b* designate diode and semiconductor switches, 14*a*, 14*b*, 14*c* and 14*e* designate wire interconnections, 15*a* designates an insulating substrate, 24*a* and 24*b* designate gate signal terminals, 25*a* and 25*b* designate ground terminals, and 27*a* and 27*b* designate drain signal terminals. The terminals 2, 3 and 4 are respectively provided with wiring mounting holes. A conductor board constituting the output terminal 4 is bonded to its corresponding substrate conductor pattern 12*b* by solder or the like. Threaded holes 8 are used to secure a cooling fin and a radiating plate 7 with bolts or the like.

Figure 13:
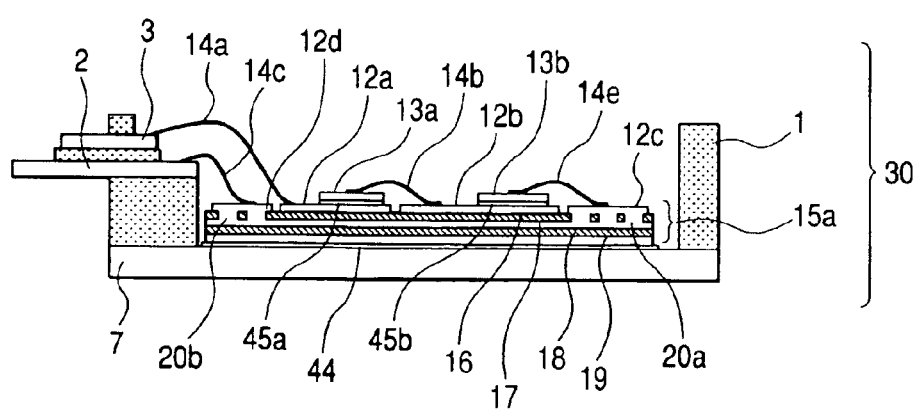
FIG. 13 is a wiring structural view of the semiconductor device shown in FIG. 12.

FIG. 13 shows a sectional structure taken along line A—A', of the semiconductor device shown in FIG. 12. In FIG. 13, reference numeral 30 designates a semiconductor device, 1 designates a case, 2 designates a negative polarity DC terminal, 3 designates a positive polarity DC terminal, 7 designates a radiating plate, 11 designates an insulating board, 12*a*, 12*b*, 12*c* and 12*d* designate substrate conductor patterns, 13*a* and 13*b* designate semiconductor switches, 14*a*, 14*b* and 14*c* designate wire interconnections, 15*a* designates an insulating substrate, 16 and 18 designate insulating boards, 17 and 19 designate conductor boards, 20*a* and 20*b* designate conductors, 40 designates solder, and 45*a* and 45*b* designate solders.

In FIG. 13, the insulating substrate 15*a* comprises the substrate conductor patterns 12*a*, 12*b*, 12*c* and 12*d*, the insulating boards 16 and 18, the conductor boards 17 and 19, and the conductors 20*a* and 20*b*. The substrate conductor patterns 12*c* and 12*d* formed on the insulating substrate 15*a* are respectively brought into conduction by the conductor 17 lying in an internal layer of the insulating substrate 15*a*, and the conductors 20*a* and 20*b* extending through an insulating layer lying therebetween. Further, the insulating board 18 insulates the conductor board 17 from the conductor board 19.

As seen from FIGS. 12 and 13, the present embodiment provides a wiring structure wherein in the second embodiment shown in FIG. 8, one insulating substrate and its peripheral wiring constituting one bridge circuit have been extracted. The present embodiment brings about effects such as a size reduction, a reduction in inductance, etc. for the reasons similar to those of the second embodiment of FIG. 8.

In addition, as shown in the sectional view of FIG. 13, the negative polarity DC terminal 2 and the positive polarity DC terminal 3 are superimposed on each other with an insulator interposed between conductor boards respectively constituting the negative polarity DC terminal 2 and the positive polarity DC terminal 3. And a structure, in which terminal portions on the lower side are extended out, is provided. Thereby the present embodiment is set to the form of a layout in which the inductance of each terminal portion is reduced in a manner similar to FIG. 10. Thus, the preset embodiment realizes a wiring layout in which each DC terminal portion is simple in structure and the effect of reducing the inductance is great, as compared with the wiring structure of FIG. 8.

The present embodiment is effective in downsizing a device constitutable by one bridge circuit and enhancing its reliability as in a DC current/DC current converting device.

While the present embodiment constitutes the bridge circuit by the two semiconductor switches on the basis of the second embodiment of FIG. 8, the present embodiment may be laid out based on the bridge circuit in which the semiconductor switches are arranged in parallel as in the third embodiment of FIG. 10.

Figure 14:
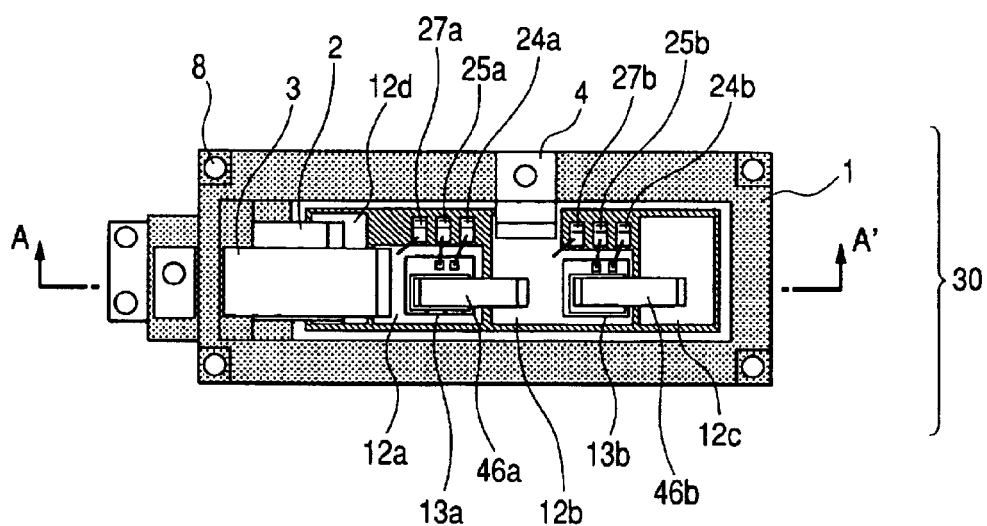
FIG. 14 is a wiring structural view of a semiconductor device according to a fourth embodiment of the present invention.

A semiconductor device according to a fourth embodiment of the present invention, having a structure in which each semiconductor switch is improved in radiation performance, will next be explained with reference to FIGS. 14 and 15. FIG. 14 is a plan view of the semiconductor device according to the present embodiment. In FIG. 14, the upper surface portion of a case of the semiconductor device has been omitted to show an internal wiring structure.

In FIG. 14, reference numeral 30 designates a semiconductor device, 1 designates a case, 2 designates a negative polarity DC terminal, 3 designates a positive polarity DC terminal, 4 designates an output terminal, 13a and 13b designate diode and semiconductor switches, 15a designates an insulating substrate, 24a and 24b designate gate signal terminals, 25a and 25b designate ground terminals, 27a and 27b designate drain signal terminals, and 46a and 46b designate conductor blocks. The terminals 2, 3 and 4 are respectively provided with wiring mounting holes. A conductor board constituting the output terminal 4 is bonded to its corresponding substrate conductor pattern 12b by solder or the like. Threaded holes 8 are used to secure a cooling fin and a radiating plate 7 with bolts or the like.

Figure 15:
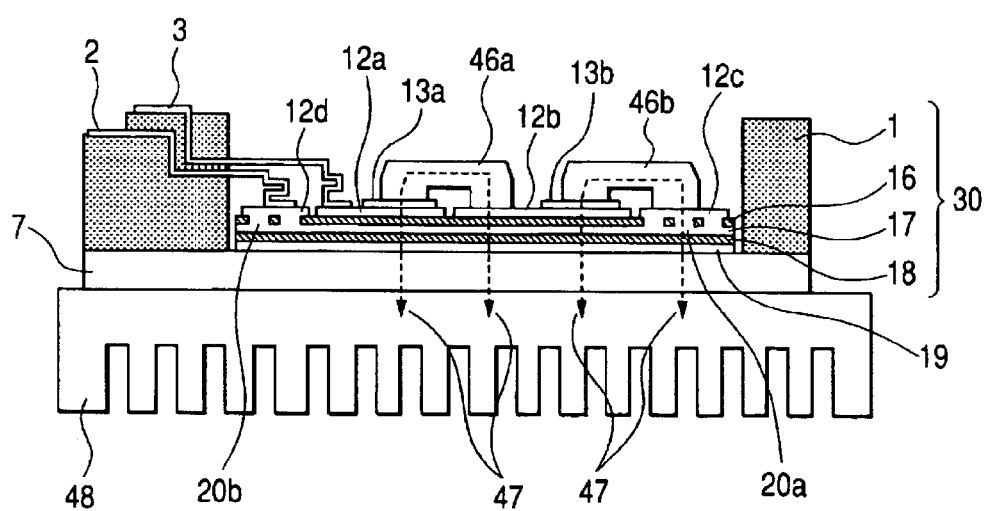
FIG. 15 is a section structural view of the semiconductor device shown in FIG. 14.

FIG. 15 shows a sectional structure taken along line A—A', of the semiconductor device shown in FIG. 14. In FIG. 15, reference numeral 30 designates a semiconductor device, 1 designates a case, 2 designates a negative polarity DC terminal, 3 designates a positive polarity DC terminal, 7 designates a radiating plate, 11 designates an insulating board, 12a, 12b, 12c and 12d designate substrate conductor patterns, 13a and 13b designate semiconductor switches, 15a designates an insulating substrate, 16 and 18 designate insulating boards, 17 and 19 designate conductor boards, 20a and 20b designate conductors, 40 designates solder, 45a and 45b designate solders, and 46a and 46b designate conductor blocks. The conductor block 46a is made of a material such as copper good in electrical conductivity and thermal conductivity and electrically connects the semiconductor switch 13a and the substrate conductor pattern 12b by bonding based on solder or the like, or by pressure developed using a pressure mechanism provided at its upper surface. Similarly, the conductor block 46b also electrically connects the semiconductor switch 13b and the substrate conductor pattern 12c.

In the present embodiment, the spots where the wire interconnections are used, are replaced by the conductor blocks 46a and 46b in the third embodiment of FIG. 10 and the like, so that heat generated in the semiconductor switches are radiated also from paths passing through the conductor blocks as indicated by dotted lines in FIG. 15.

In addition to the enhancement of radiation by the conductor blocks, in the layout of the insulating substrate 15a employed in the present embodiment, the conductor block 46b is bonded onto the structure good in thermal conductivity, wherein the substrate conductor pattern 12c and the conductor board 17 are connected by the conductor 20a. Consequently, the conductor block 46b has the effect of enhancing the efficiency of thermal radiation. This is effective in reducing the cost from the result that a rise in the temperature of each semiconductor chip is suppressed by the enhancement of radiation, and an improvement in reliability or an ability required of a cooler could be lightened.

Figure 16:
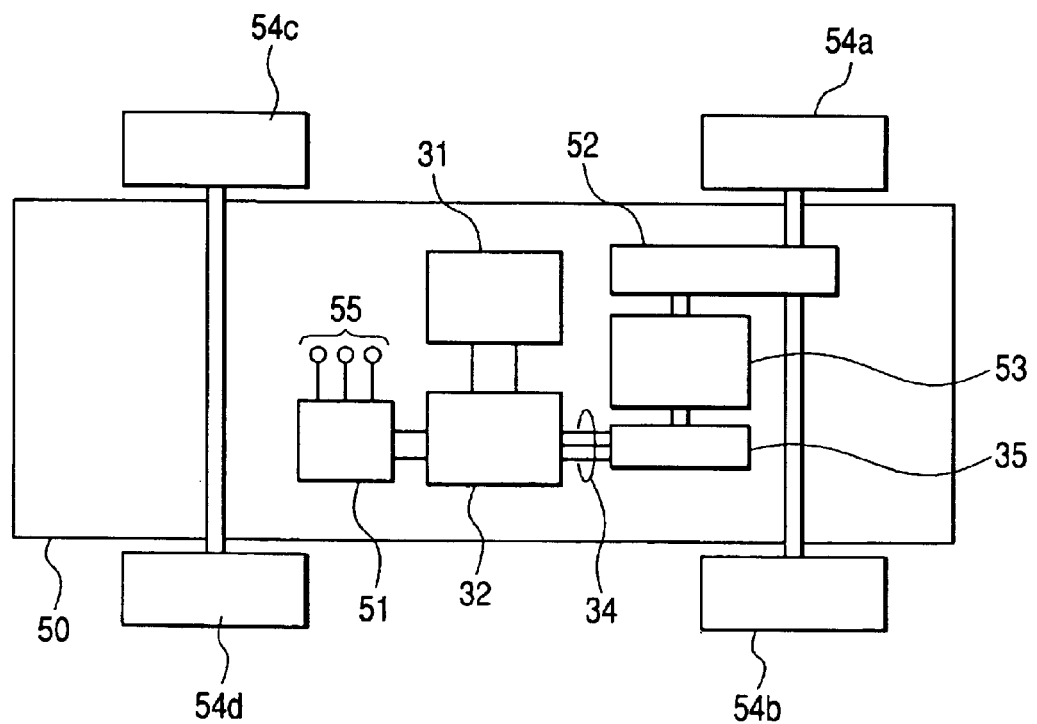
FIG. 16 is a configurational view of a drive system of a vehicle equipped with a power converter using a semiconductor device of the present invention, illustrated as a sixth embodiment of the present invention.

A drive system of a vehicle, which is equipped with a power converter using a semiconductor device of the present invention as a sixth embodiment of the present invention, will next be explained. FIG. 16 is a configurational diagram of the vehicle drive system according to the present embodiment.

In FIG. 16, reference numeral 35 designates a motor, 32 designates a power converter, 31 designates a DC power source, 34 designates an output wiring, 50 designates a vehicle, 51 designates a controller, 52 designates a transmission system, 53 designates an engine, 54a, 54b, 54c and 54d designate wheels, and 55 designates signal terminals. The signal terminals respectively receive signals with respect to the state of vehicle's driving, and start, acceleration, deceleration and stop commands given from a driver. The controller 51 transmits a control signal to the power converter, based on information received from the corresponding signal terminal to drive the motor 35. The motor 35 transmits torque to an engine shaft to drive the wheels through the transmission system 52.

That is to say, even when the engine 53 of the vehicle has stopped, the drive system shown in FIG. 16 is capable of driving the wheels 54a and 54b by use of the motor 35. Even when the engine 53 is running, the drive system is capable of providing also torque assist. Further, the motor 35 is driven by the engine 53, and an ac current generated in the motor 35 is converted into a DC current by the power converter 32, whereby it can be used for charging the DC power supply 31 and some of kinetic energy can be used in the generation of power by the above method during engine deceleration.

Since the system for implementing such functions is capable of ceasing idling at the stop of the engine and generating power with satisfactory efficiency, it brings about the effect of increasing fuel efficiency of the vehicle.

Since, however, the drive system of FIG. 16 needs large torque during driving the wheels by the motor 35 alone or torque assist drive, it is necessary to drive the motor 35 with a large current. A power converter capable of controlling the large current is therefore essential. Since a mountable space is restricted, there is a need to provide a semiconductor device that makes it possible to implement a small-sized power converter. Using the semiconductor device of the present invention makes it possible to realize a power converter capable of controlling a large current and small in size. A vehicle having a drive system using such a power converter can be provided.

What is claimed is:

1. A semiconductor device comprising:
   at least two controllable semiconductor switches connected in a bridge form;
   at least one output terminal;
   at least two positive/negative polarity DC terminals; and
   an insulating substrate including a conductor section for mounting the semiconductor switches thereon;
   wherein the insulating substrate is configured such that at least two conductor layers having a conductor section on a surface thereof and in an inner layer thereof to bridge-connect the semiconductor switches and the DC terminals and at least two insulating layers are alternately laminated,
   the surface and inner-layer conductor layers interposing the insulating layer therebetween are electrically connected by a conductor passing through the insulating layer interposed between the conductor layers, and
   a current path is so provided as to allow a current flowing through a bridge circuit for mounting said at least two semiconductor switches on the insulating substrate to flow in opposite directions between the conductor layers interposing the insulating layer therebetween.

2. A semiconductor device comprising:
   at least two controllable semiconductor switches connected in a bridge form;
   at least one output terminal;
   at least two positive/negative polarity DC terminals; and
   an insulating substrate including a conductor section for mounting the semiconductor switches thereon;
   wherein the insulating substrate is configured such that at least two conductor layers having a conductor section on a surface thereof and in an inner layer thereof to bridge-connect the semiconductor switches and the DC terminals and at least two insulating layers are alternately laminated, the surface and inner-layer conductor layers interposing the insulating layer therebetween are electrically connected by a conductor passing through the insulating layer interposed between the conductor layers, a current path is so provided as to allow a current flowing through a bridge circuit for mounting said at least two semiconductor switches on the insulating substrate to flow in opposite directions between the conductor layers interposing the insulating layer therebetween, and a wiring layout is configured in which the semiconductor switches are not mounted on the surface conductor layer connected to the conductor passing through the insulating layer.

3. A semiconductor device comprising:

at least two controllable semiconductor switches connected in a bridge form;

at least one output terminal;

at least two positive/negative polarity DC terminals;

an insulating substrate including a conductor section for mounting the semiconductor switches thereon; and a radiating plate mounting the insulating substrate thereon;

wherein the insulating substrate is configured such that at least two conductor layers having a conductor section on a surface thereof and in an inner layer thereof to bridge-connect the semiconductor switches and the DC terminals and at least two insulating layers are alternately laminated, the surface and inner-layer conductor layers interposing the insulating layer therebetween are electrically connected by a conductor passing through the insulating layer interposed between the conductor layers, a current path is so provided as to allow a current flowing through a bridge circuit for mounting said at least two semiconductor switches on the insulating substrate to flow in opposite directions between the conductor layers interposing the insulating layer therebetween, a wiring layout is configured in which the semiconductor switches are not mounted on the surface conductor layer connected to the conductor passing through the insulating layer, and a conductor block is used for a connection between an upper surface of electrode of the semiconductor switch and the surface conductor layer to form a radiation path of the semiconductor switch to the radiation plate.

* * * * *